(12) United States Patent
Dykaar

(10) Patent No.: US 9,224,851 B2
(45) Date of Patent: Dec. 29, 2015

(54) PLANARIZED SEMICONDUCTOR PARTICLES POSITIONED ON A SUBSTRATE

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo, Ontario (CA)

( * ) Notice: Subject to any disclaimer, the term of this patent is extended or adjusted under 35 U.S.C. 154(b) by 116 days.

(21) Appl. No.: 13/992,063

(22) PCT Filed: Oct. 12, 2012

(86) PCT No.: PCT/CA2012/000956
§ 371 (c)(1),
(2) Date: Jun. 6, 2013

(87) PCT Pub. No.: WO2013/053052
PCT Pub. Date: Apr. 18, 2013

(65) Prior Publication Data
US 2014/0070223 A1    Mar. 13, 2014

Related U.S. Application Data

(60) Provisional application No. 61/547,110, filed on Oct. 14, 2011.

(51) Int. Cl.
*H01L 29/78* (2006.01)
*H01L 21/02* (2006.01)
(Continued)

(52) U.S. Cl.
CPC ............ *H01L 29/78* (2013.01); *H01L 21/0243* (2013.01); *H01L 21/0259* (2013.01);
(Continued)

(58) Field of Classification Search
CPC .............. H01L 21/02532; H01L 29/78; H01L 21/02636; H01L 29/0657; H01L 29/04; H01L 29/66477; H01L 21/0259; H01L 29/0665; H01L 21/0243; H01L 21/02439; H01L 27/092; H01L 21/8238
See application file for complete search history.

(56) References Cited

U.S. PATENT DOCUMENTS

| 3,025,335 A | 3/1962 | Ralph |
| 3,649,354 A | 3/1972 | Te Velde |

(Continued)

FOREIGN PATENT DOCUMENTS

| DE | 112006000411 | 2/2008 |
| EP | 1102332 A2 | 5/2001 |

(Continued)

OTHER PUBLICATIONS

Y. Wang, et al. Large-area self assembled monolayers of silica microspheres formed by dip coating. Materials Science-Poland, vol. 28, No. 2, 2010.

(Continued)

*Primary Examiner* — Jae Lee
*Assistant Examiner* — Mohammed R Alam
(74) *Attorney, Agent, or Firm* — Perry + Currier, Inc.

(57) ABSTRACT

A device and method of fabricating a device in the form of an array of planarized particles of single crystal silicon or poly crystal silicon wherein the planar surfaces of the particles is used to fabricate an array of electronic devices. This is particularly useful in the manufacture of large displays where single crystal high speed devices are required. The planar surfaces of the array of devices are coplanar when the array is fabricated on a planar substrate.

19 Claims, 8 Drawing Sheets

(51) Int. Cl.

| | |
|---|---|
| *H01L 29/06* | (2006.01) |
| *H01L 29/04* | (2006.01) |
| *H01L 29/66* | (2006.01) |
| H01L 21/8238 | (2006.01) |
| H01L 27/092 | (2006.01) |

(52) U.S. Cl.
CPC .... *H01L21/02439* (2013.01); *H01L 21/02532* (2013.01); *H01L 21/02636* (2013.01); *H01L 29/04* (2013.01); *H01L 29/0657* (2013.01); *H01L 29/0665* (2013.01); *H01L 29/66477* (2013.01); *H01L 21/8238* (2013.01); *H01L 27/092* (2013.01)

(56) References Cited

U.S. PATENT DOCUMENTS

| | | | |
|---|---|---|---|
| 3,998,659 | A | 12/1976 | Wakefield |
| 4,270,263 | A | 6/1981 | Johnson et al. |
| 4,470,874 | A | 9/1984 | Bartush et al. |
| 4,614,835 | A | 9/1986 | Carson et al. |
| 4,637,855 | A | 1/1987 | Witter et al. |
| 4,872,607 | A | 10/1989 | Jensen et al. |
| 5,069,740 | A | 12/1991 | Levine et al. |
| 5,091,319 | A | 2/1992 | Hotchkiss et al. |
| 5,377,031 | A | 12/1994 | Vu et al. |
| 5,469,020 | A | 11/1995 | Herrick |
| 5,945,725 | A | 8/1999 | Ishikawa |
| 6,204,545 | B1 * | 3/2001 | Nakata .......................... 257/459 |
| 6,464,890 | B2 | 10/2002 | Knappenberger et al. |
| 6,528,379 | B2 * | 3/2003 | Takada et al. ................. 438/322 |
| 6,679,998 | B2 | 1/2004 | Knappenberger et al. |
| 6,744,073 | B1 * | 6/2004 | Nakata ............................ 257/81 |
| 7,091,073 | B2 | 8/2006 | Inoue |
| 7,205,626 | B1 | 4/2007 | Nakata |
| 7,811,839 | B2 | 10/2010 | Kasahara et al. |
| 8,999,742 | B1 | 4/2015 | Lowenthal et al. |
| 2002/0050061 | A1 | 5/2002 | Komyoji et al. |
| 2004/0016456 | A1 | 1/2004 | Murozono et al. |
| 2007/0069642 | A1 * | 3/2007 | Kitai et al. .................... 313/511 |
| 2008/0121987 | A1 | 5/2008 | Chen |
| 2010/0052511 | A1 | 3/2010 | Keesmann |
| 2010/0216076 | A1 | 8/2010 | Hong et al. |
| 2011/0186862 | A1 * | 8/2011 | Harada et al. .................... 257/77 |
| 2011/0272706 | A1 * | 11/2011 | Kwak et al. ...................... 257/76 |

FOREIGN PATENT DOCUMENTS

| | | |
|---|---|---|
| JP | 2011181534 A | 9/2011 |
| KR | 20080104947 A | 12/2008 |
| WO | 2005024951 A1 | 3/2005 |
| WO | 2013053052 A1 | 4/2013 |

OTHER PUBLICATIONS

Xia, Deying et al. Lithographically directed deposition of silica nanoparticles using spin coating. Center for High Technology Materials and Department of Electrical and Computer Engineering, University of New Mexico, 1313 Goddard SE, Albuquerque, New Mexico 87106. (Published Dec. 14, 2004).

Zhu, Ting et al. Mechanics of a process to assemble microspheres on a patterned electrode. Applied Physics Letters 88, 144101 (2006).
Victor V. Zhirnov et al. New Frontiers: Self-Assembly and Nanoelectronics. Semiconductor Research Corp. Jan. 2001.
Takeda, Nobuo: MEMS applications of Ball Semiconductor Technology.
Choi et al. TFT Backplane Technologies for AMCLD and AMOLED Applications. Journal of the Korean Physical Society, vol. 54. No. 1, Jan. 2009, pp. 549-553.
Hamer et al. 63.2: AMOLED Displays using Transfer-Printed Integrated Circuits SID Symposium Digest of Technical Papers, vol. 40 Issue 1, pp. 947-950, Jun. 2009.
Findikoglu et al. Aligned-Crystalline Silicon Films on Non-Single-Crystalline Substrates LosAlamos National Laboratory.
CBrite Marketing Document—Enabling the "displays of tomorrow", TODAY!
Rogers et al.: Synthesis, assembly and applications of semiconductor nanomembranes; Nature, vol. 477, Sep. 1, 2001; pp. 45-51.
Tien et al.: Microfabrication through Electrostatic Self-Assembly Langmuir 1997, vol. 13, pp. 5349-5355.
Gharghi et al.: Growth and Structural Characterization of Spherical Silicon Crystals Grown from Polysilicon. Journal of Electronic Materials, vol. 37, No. 11, 2008; pp. 1657-1664.
Sakariya et al.: Vt-Shift Compensating Amorphous Silicon Pixel Circuits for Flexible OLED Displays Materials Research Society Symp. Proc. vol. 736, 2003; pp. D7.15.1 to D7.15.6.
Anonymous: AngstromSphere Dispersion Technique.
Kwon, Oh-Kyong: TFT Mobility Requirement for AMOLED HDTVs Division of Elecatrical and Computer Engineering, Hanyang University, Korea.
Zhao et al: Novel Method for Fabricating Flexible Active Matrix Organic Light Emitting Diode (AMOLED) Displays Copyright 2011 Hewlett-Packard Development Company, L.P.
Kim et al.: A Review of Recent Advances in Backplanes and Color Patterning Technologies for AMOLED Display Photonics Society Newsletters, Apr. 2013.
Gharghi, Majid, "Three-Dimensional Modeling and Simulation of p-n Junction Spherical Silicon Solar Cells", (Jun. 2006) IEEE Trans. Electron Devices, vol. 53, No. 6, pp. 1355-1363.
International Search Report, Jan. 30, 2013, PCT/CA2012/000956.
Omae, Satoshi et al. "Crystal Characterization of Spherical Silicon Solar Cell by X-ray Diffraction" Japanese Journal of Applied Physics, vol. 45, No. 5A, 2006, pp. 3933-3937.
Zhu, Ting et al. "Mechanics of a Process to Assemble Microspheres on a Patterned Electrode" Applied Physics Letters 88, 144101 (2006).
McKee, William R.—Development of the Spherical Silicon Solar Cell; IEEE Transactions on Components, Hybrids and Manufacturing Technology, vol. CHMT-5, No. 4, Dec. 1982.
Supplementary Parital European Search Report, Apr. 30, 2015, issued on Related European Patent Application No. EP12839944.
Talghader, Joseph J. "Integration of LEDs and VCSELs using fluidic self-assembly." Optoelectronics and High-Power Lasers & Applications. International Society for Optics and Photonics, 1998.
Wirner, Christoph, "Extended European Search Report", European Patent Application No. 14182511.7, issued Jul. 14, 2015.
Gotz, Andreas, "Extended European Search Report", European Patent Application No. 12839944.1, issued Sep. 9, 2015.

* cited by examiner

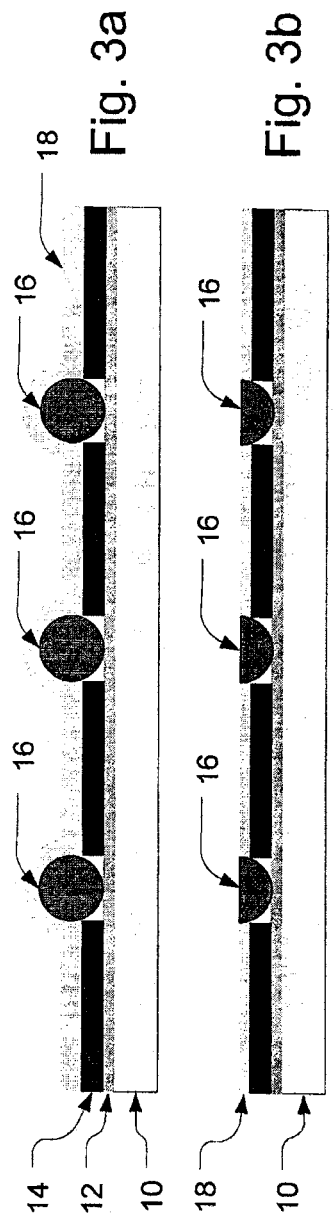

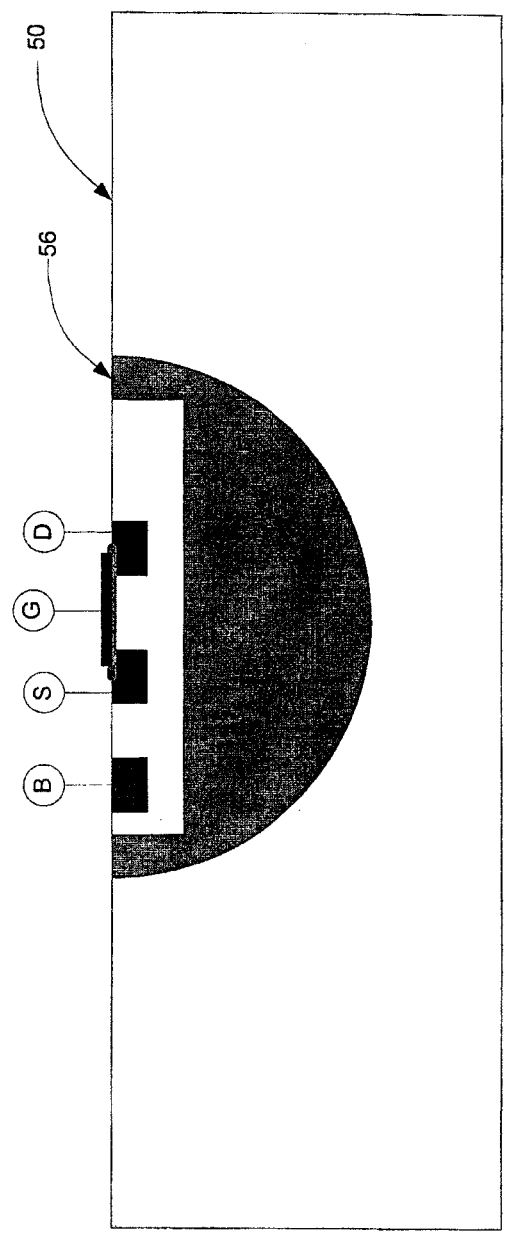

PLANARIZED SEMICONDUCTOR PARTICLES POSITIONED ON A SUBSTRATE

FIELD OF THE INVENTION

This invention relates generally to a device and method of manufacturing wherein a plurality of planarized semiconducting particles are located at predetermined locations upon a substrate to form localized regions suitable for planar electronic device fabrication on, in, or under a region of the planarized surface.

BACKGROUND OF THE INVENTION

Single-crystal silicon is used for most electronic applications. Exceptions exist, such as displays and some imagers, where amorphous silicon is applied to glass substrates in order to operate the display or imager pixel. In many applications, the display or imager is fabricated on top of the silicon electronics. For application to liquid crystal displays (LCDs), amorphous silicon has provided sufficient performance. For next generation display devices such as Organic Light Emitting Diodes (OLED), Active Matrix (AM) drive transistors made from amorphous silicon have proven problematic. Fundamentally, LCDs use voltage devices, and AM-OLEDs require current devices. Attempts to extend the conventional approach involve modifying the prior-art amorphous-silicon on glass. Amorphous-silicon is applied to the entire substrate panel, typically greater than two meters on a side, then is re-crystallized using large excimer lasers and scanning a line focus across the panel. The laser has to be pulsed so as to only melt the Si surface and not the glass. This technique results in the formation of poly-crystal silicon rather than single-crystal silicon.

The mobility of any type of amorphous or poly-crystalline transistor, including non-silicon and organic devices, is much smaller than the mobility of single-crystal silicon transistors. Electron mobility in amorphous silicon is ~1 $cm^2/V \cdot s$ compared to ~100 $cm^2/V \cdot s$ for poly-silicon, and ~1500 $cm^2/V \cdot s$ for high-quality single-crystal silicon. It is therefore advantageous to use single-crystal silicon in place of amorphous silicon in such devices. In a preferred embodiment of the present invention a plurality of planar single-crystal silicon regions on a non-silicon substrate at predetermined locations, for the purpose of electronic device fabrication is fabricated. For example, wafers of single crystal silicon are too costly for large displays and too small in size: Silicon wafers are typically 300 mm in diameter, compared to current LCD panels at more than 2 meters on a side. By comparison, approximately spherical particles, spheres or spheroidal particles of single-crystal silicon have been manufactured in large sizes less than or equal to 2 mm, which is large compared to individual pixel sizes. U.S. Pat. No. 4,637,855, incorporated herein by reference, entitled Process For Producing Crystalline Spherical Spheres, Filed Apr. 30, 1985 in the names of Witter et al., describes the manufacture of crystalline spheres.

In the past others have attempted to place diodes upon a curved surface of a silicon spheroid however this has proved to be challenging. In the prior art, attempts have been made to lithographically define structures on spherical surfaces, but this requires non-standard optics and has had limited success. Making electrical contacts to non-planar surfaces also requires non-standard techniques. The complexities involved in fabrication have prevented any real progress.

Curved surfaces of Si spheres have also been doped with an n-type dopant to form n-type Si surrounding a p-type Si region which comprises the majority of the surface of a sphere. An embodiment of this invention relates to the field of photovoltaic devices, in that the planar surface and region directly below can be doped for example with an n-type dopant and a region below with a p-type dopant so as to form a solar cell. A silicon sphere solar cell is described in a paper entitled Crystal Characterization of Spherical Silicon Solar Cell by X-ray Diffraction by Satoshi OMAE, Takashi MINEMOTO, Mikio MUROZONO, Hideyuki TAKAKURA and Yoshihiro HAMAKAWA, Japanese Journal of Applied Physics Vol. 45, No. 5A, 2006, pp. 3933-3937 #2006 The Japan Society of Applied Physics.

This invention however overcomes the limitations of the aforementioned prior art by conveniently utilizing the surface area and region about the planar surface on a planarized particle to fabricate electronic devices. A planar region having structures formed therein provides a convenient reliable way in which to provide electrical contacts to different parts of the device.

Another very important aspect of this invention is that it enables technology that has a smaller carbon footprint by allowing circuits to be built that consume less power than similar circuitry which utilizes LCD technology.

In displays with previous generation LCD technology, white light is provided to the rear of the panel of the display, and each LCD pixel uses a filter to select Red (R), Green (G), or Blue (B) light. Filtering in this manner wastes ⅔ of the energy in the backlight. In addition the operation of the LCD pixel is dependent on the light being polarized, so further losses are incurred by the polarizer. In addition, part of each pixel is occupied by the amorphous silicon transistor, which blocks light coming through the panel.

The present invention enables production of large OLED panels, which are more efficient that LCD panels. OLED pixels emit at the desired color, R, G, or B only, so no energy is wasted creating other colors, which are then filtered out and which produce waste in the form of heat. In addition, the OLED emitters can be fabricated on top of the backplane electronics, so the emission area can be maximized without blocking light emitting areas of the pixel. By placing the backplane electronics out of the light path, the design can be optimized for speed and low power dissipation, as opposed to being compromised for light path requirements.

SUMMARY OF THE INVENTION

In accordance with this invention there is provided, a semiconductor device comprising:
 a substrate;
 a semiconductor particle fixed upon the substrate, said particle having a planar surface of less than 15 mm wherein at least a portion of said particle below or on the planar surface is doped with a first dopant of a first type and a second dopant of a second type;
 a first contact at or above the planar surface contacting the first dopant; and,
 a second contact at or above the planar surface contacting the second dopant;
 wherein the other of the first and second dopants are n-type.

In accordance with the invention there is further provided, an electronic device for generating current or responsive to an input current or voltage comprising:
 a plurality of semiconductor particles fixed upon a substrate, each particle having:
  a) a planar surface wherein at least a portion of said particle is doped with a first dopant;

b) wherein an electrical contact is connected to a region of the spherical semiconductor particle containing the first dopant;

c) wherein one or more regions of said particle directly below or on the planar surface of the particle are doped with a second dopant and;

d) wherein one or more contacts are formed on or above the planar surface which contact the one or more regions doped with the second dopant; and, wherein one of the first and second dopants are p-type and wherein the other of the first and second dopants are n-type.

In accordance with another an aspect of the invention there is provided one or more electronic circuits for generating current or responsive to an input current or voltage comprising:

a plurality of truncated spherical semiconductor particles, each particle having:

a planar surface wherein at least a portion of said particle is doped with a first dopant;

wherein an electrical contact is connected to a region of the spherical semiconductor particle containing the first dopant;

wherein one or more regions of said particle directly below or on the planar surface of the particle are doped with a second dopant and;

wherein one or more contacts are formed on or above the planar surface which contact the one or more regions doped with the second dopant; and, wherein one of the first and second dopants are p-type and wherein the other of the first and second dopants are n-type.

In accordance with another aspect of this invention there is provided a substrate having a plurality of semiconductor spherical particles disposed at predetermined locations spaced from one another, wherein the spherical particles are planarized to form flattened surfaces and wherein the flattened surfaces have electronic circuits thereon or directly thereunder and at least two contacts at or supported by each of the flattened surfaces.

In accordance with the invention there is provided a device comprising a plurality of single crystal silicon particles, approximately spherical or spheroid in shape, deposited at predetermined locations on a substrate of a different material, wherein the single crystal particles are conformally coated and planarized to form localized regions about a planarized surface each having an electronic device fabricated on, in or under each planarized surface.

In accordance with another aspect of the invention a method of forming a plurality of electronic devices on a substrate is provided, comprising:

positioning semiconductor particles at predetermined locations on the substrate;

immovably fixing of the semiconductor particles in positions at the predetermined locations;

removing portions of each of the particles so as to expose cross-sections of the particles, wherein the cross-sections are planar surfaces less than 15 mm across the planar surface in a longest dimension and greater than 1 μm across the planar surface in a longest dimension; and providing a controllable gated electronic component on or directly beneath each planar surface and providing at least two electrical contacts to the component supported by the planar surface.

Electronic devices formed on or directly under these planarized surfaces include but are not limited to transistors, diodes, capacitors, non-linear resistors that may be formed by doping the planarized sphere or subsequently overlaid on the planarized surface such as LEDs or photodetectors.

In another embodiment a solar cell or array of cells is provided wherein a particle is doped throughout with a first doping type and is subsequently doped with another dopant type creating a junction, or diode near the surface of the semiconductor particle. The planarization techniques described herein present an approach to contacting the surface of the particle from the planar surface which overcomes the complexity and reliability issued associated with contacting the semiconductor particle using non-planar techniques.

This invention allows a functional electrical device such as a transistor to be formed on a planar surface of a single sphere.

BRIEF DESCRIPTION OF THE DRAWINGS

Exemplary embodiments of the invention will now be described in accordance with the drawings in which:

FIG. 3a is a cross-sectional view of semiconducting spherical particles deposited on a gridded substrate having a conformal coating deposited on top of the spherical particles.

FIG. 3b is a cross-sectional view of the semiconducting spherical particles shown in FIG. 3a after being planarized.

FIG. 5b is a cross-sectional view of a single transistor device fabricated within a single planarized sphere.

DETAILED DESCRIPTION

Figure 1:
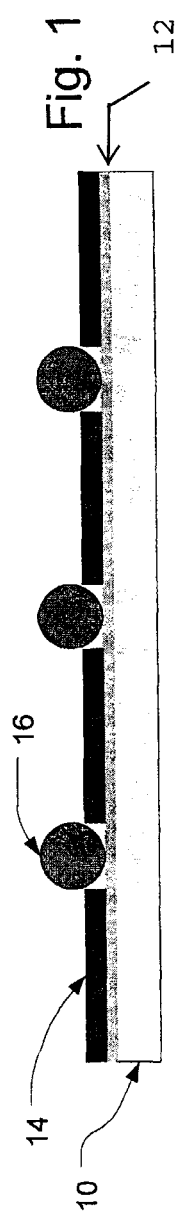
FIG. 1 is a cross-sectional view of an array of semi-conducting spheres placed adhesively upon a substrate so as to permanently affix the spheres at predetermined locations.

Turning now to FIG. 1 a substrate 10 is shown which may be plastic, glass, semiconductor material or any other suitable stable material for supporting an electronic circuit. An adhesive layer 12 is applied to an upper surface of the substrate 10 which has a grid 14 having predetermined gaps between grid elements suitably sized to contain semi-conducting spheres 16, having a diameter of less than 15 mm and preferably less than 2 mm. The term semiconducting sphere, used hereafter, is to include spheres, spheroids and semiconducting sphere-like objects which may have imperfections, due to defects in forming the spheres. The arrangement shown in FIG. 1 conveniently allows a circuit designer to have a great deal of control in determining where spherical semiconducting material is to be located, and as a result, where semiconductor devices residing on planar surfaces of the spheres 16 are to be fabricated after the spheres are planarized. Although the grid is shown with same spacing between grid openings, a grid having non-uniform spacing can be used to locate spheres in any desired pattern. If the electronic devices were fabricated on the planar surfaces prior to positioning the spheres on the substrate, orienting the spheres would be very difficult. Therefore, the semiconducting spheres 16 are first fixedly attached to the substrate 10 and are subsequently planarized so as to expose regions of high-quality semi-conductor material within the interior of the sphere suitable for fabrication of silicon electronics; by way of example, CMOS devices can be formed at the planar layer by doping the material of the sphere at the planar layer and beneath. Spherical particles are described in detail and are particularly convenient to position and planarize, however many other particle shapes can be used, as long as the particles can be positioned and secured to a substrate conveniently and as long as the particles can be planarized so as to provide a surface on which to fabricate electronic devices.

Typically, for most chip-based electronics, the unused chip area is reduced to a minimum so the device density is high. The density is so high, that the unused substrate area wasted by not having an active device fabricated thereon is small. In displays and imagers, the device area is specified by requirements that are not electronic. As a result, as the displays become larger, the device density becomes lower. At some point, coating several square meters with low-quality Si to make a few devices, or a few million compared to 100s of millions in a PC CPU, is no longer desirable. In accordance with this invention, high-quality Si is placed only where it is needed, thereby covering a lower fraction of the total display area for large displays. This technological inflection point should occur as a result of the impending crossover to faster OLED devices. OLEDs are current devices, and amorphous silicon on glass cannot deliver the required current and speed.

Silicon spheres have been used previously to manufacture large area photovoltaic panels as described in U.S. Pat. No. 4,614,835 Photovoltaic Solar Arrays Using Silicon Microparticles, Filed Dec. 30, 1983, in the names of Carson et al, incorporated herein by reference. For photovoltaic applications the surface of the sphere forms the active area. Silicon spheres can be made from low cost powdered silicon and the resulting re-crystallized surface layer of silicon dioxide can getter significant impurities. Repeated melting cycles can improve the overall material purity. Even in the case of polycrystalline particles, the electron mobility is many times that of amorphous silicon.

In accordance with this invention, it was discovered that for electronic devices, it is preferable to fabricate devices using the flat surface of a cross section of a semiconductor particle such as a sphere rather than the curved outer surface. The flat surface allows the use of standard lithography techniques, allowing the fabrication of transistors, interconnects, etc. For example, a silicon sphere 20 microns in diameter, provides a maximum area, $A=\pi \times r^2 = \sim 314$ microns$^2$ for device fabrication. Many transistors with gate lengths on the order of 1 micron can be fabricated within such an area. For large area displays, only a few transistors are required for each pixel and pixel size doesn't scale with display size; High Definition (HD) is a standard resolution (e.g. 1920×1080 pixels). In addition, one flat area of high quality, single-crystal silicon can service more than one pixel, as well as provide added functionality such as self-test and display performance monitoring and correction.

The use of the flat cross section of a planarized particle such as a truncated planarized sphere allows the use of standard photolithographic fabrication techniques. Furthermore, by planarizing, imperfections that occur on the surface of the sphere or spheroid are removed as the sphere or spheroid is etched or polished to expose the inner region. Conveniently, because the spheres are purified in a separate process, high-purity single-crystal material can be realized using high temperature processes not available to amorphous silicon on glass substrates as the glass substrate melts at temperatures lower than standard silicon processing temperatures. This is even more important for lower melting temperature substrates such as plastics. Truncated spheres or planarized particles of other shapes can be doped, or multiply doped just below or above their planar surface to form rings of n-type and p-type material or "wells" when the cross section is exposed; doping can also occur later in the process. This will allow the fabrication of CMOS devices as is shown in FIG. 5. Although the preferred way in which to dope a region is by ion-implantation, doping can also be achieved by spin-coating dopants onto the planarized surface. The outer surface can be highly doped or metallized to form a substrate contact that can be contacted from either the edge of the top surface or from anywhere on the spherical surface, which is the effective backside. The term contact used in this specification can be a physical wire, or a metallized contact region such as a conductive contact pad whereby a lead or wire or device can make electrical contact.

The present invention provides spherical silicon particles at known locations on a substrate, which is preferably a non-silicon substrate. Positioning the silicon spheres on a substrate can be done by any of several techniques. Most involve patterning the substrate with a plurality of locations in which spheres are to be placed. Metal or dielectric grids can be permanently or temporarily applied to the substrate first, or standard photolithographic techniques can be used. Alternatively dots, dimples, or other patterns of adhesive can be applied to locate the spheres. Adhesive material with a melting point or adhesive at room temperature appropriately matched to subsequent electronic processing should be chosen. As an alternative to a deposited or applied grid, the substrate can be patterned directly, using standard lithographic techniques to make holes in the substrate in which to deposit adhesive for fixing the semi-conductor spheres.

In another embodiment, silicon particles can be used to form a monolayer on the substrate surface in substitution for non-semiconducting spheres used to form a mask, described in U.S. Pat. Nos. 6,464,890, and 6,679,998 Knappenberger et al. filed Aug. 29, 2001 and August 23 respectively, incorporated herein by reference. As long as the particles are a predetermined size, then subsequent processing can provide for planarized silicon particles such as spherical particles in the required locations.

Figure 2:
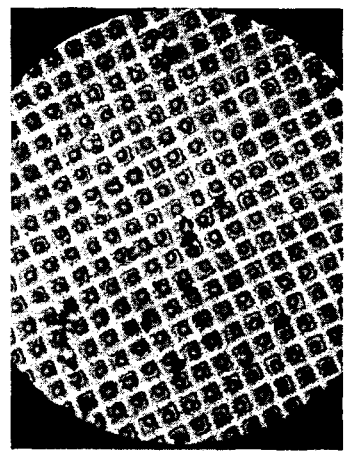
FIG. 2 is a photograph of an array of single-crystal Si spheres disposed upon a non-silicon substrate.

In FIG. 1 an exemplary technique is shown whereby a metal grid 14 is used with an adhesive layer 12. Spheres 16 are subsequently placed on the surface in sufficient quantity such that the use of mechanical vibration to move the spheres around on the grid results in complete occupation of the grid openings. The mechanical vibration causes the silicon spheres 16 to move around the volume defined by the substrate, walls and a cover. In a very short time, the spheres 16 move around to such a degree that the probability of encountering an available grid location is unity, as long as spheres are still available. FIG. 2 shows a photomicrograph of such a device made on a glass substrate with a grid. In this exemplary case, glass spheres are used and are 20 microns in diameter. Mechanical vibration was used to move the glass spheres around on the grid. High voltage (V≤12 kV) was then applied to the grid to help remove spheres from the top surface of the grid. Some excess spheres and dirt can also be seen, but these would be reduced or eliminated in a clean room environment and/or removed in subsequent processing steps.

For large areas, spheres can be applied in a dense line across the surface in one direction and then vibrated across the surface of the substrate in a wave.

Alternatively, electric fields can be applied using external electrodes in order to move the particles on the substrate as described in "Mechanics of a process to assemble microspheres on a patterned electrode," Ting Zhua, Zhigang Suob, Adam Winkleman and George M. Whitesides, APPLIED PHYSICS LETTERS 88, 144101 (2006), hereafter referred to a reference 1. In this approach an electric potential is created using a bottom electrode placed underneath the dielectric substrate and the conductive grid is used as the counter electrode. The holes in the grid create a potential well that the spheres can drop down into. The electric field gradient around the hole is sufficient to create a net force acting on the particle. For large enough applied fields (kV), the particles can be moved into the holes. Vibration may be required initially, to move the spheres around so that they encounter the potential well.

In another approach, a similar process to that used in laser printing can be utilized. In laser printers, triboelectrically generated charge is applied to toner particles. The charged toner particles are then applied to an electrostatically charged (drum) substrate. In laser printing the toner particles are then transferred to an electrostatically charged substrate typically paper. In laser printing the laser is used to write the pattern on the charged drum, but since the pattern wouldn't change in a production environment, the laser can be replaced by a grid. In first generation laser printers, toner particle size of approximately 16 microns was on the same order as the spheres of FIG. 2. By applying a voltage to an electrode underneath the dielectric substrate to attract the charged spheres, and the opposite polarity to the grid, the spheres are selectively attracted to the holes. This approach can be viewed as an enhancement of the approach described in reference 1.

In an alternative embodiment of the present invention, the array of spheres could then be transferred from the first substrate, acting similarly to laser printer drum, to another, unpatterned substrate, acting similarly to the charged paper, in a complete analogy to laser printing described. Alternatively, transferring of the array from first to second substrates can also be accomplished if the adhesive on the second, un-patterned substrate, or adhesive applied to the spheres has a higher melting temperature, greater adhesion or electrostatic attraction, for example. While the exemplary device of FIG. 1 uses an adhesive layer, the substrate or grid under layer can be a heat-softened layer, such as thermoplastic layer at elevated temperature so the spheres adhere on contact and remain in place when the substrate is cooled to ambient temperature. The adhesive can be a thin layer applied to substrate. The relatively small size of the spheres means that significant contact area is achieved for a small layer thickness of adhesive.

Since silicon has a higher melting temperature than glass, a glass substrate can be used directly if sufficiently heated to soften the glass and so allow the spheres, either coated with silicon dioxide or stripped of oxide, to adhere directly to the glass, providing an assembly that can be subjected to higher post-processing temperatures. This can be accomplished by transferring the arrayed particles from a patterned substrate onto un-patterned glass using electrostatic attraction, as in laser printing. By fixing the particles directly to the glass the window for higher temperature processing can be extended to the point where the cross sectional interior of the semiconducting spheres is exposed. The same printing process can be used for other substrates.

Once the spheres 16 are in place, a conformal coating 18 is applied and subsequently planarized using a modification of the standard planarization techniques, such as chemo-mechanical polishing, as shown in FIG. 3a where the coating layer 18 of $SiO_2$ is shown covering the spherical particles 16 and the grid 14. FIG. 3b shows the same array of FIG. 3a after planarization and before devices are fabricated on the truncated spheres in the form of hemispheres. Standard planarization techniques used in integrated circuit fabrication can be utilized. Planarization can occur multiple times in the process because as multiple layers are deposited sequentially, the topography can exceed that supported by the process, therefore after a conformal dielectric coating is applied it is then planarized; and when a conductive coating is applied it is then planarized. Connections between layers are made by opening holes or vias at lithographically defined locations and depositing conductive connections or plugs between layers. This is particularly advantageous. In the case of a planarized metal layer, the layer would be patterned to form the required interconnects. In the present invention, the process of planarization is performed to expose the interior cross-section of the semiconductor particles, as opposed to the prior art of planarizing the surface without exposing all of the underlying elements, as described in U.S. Pat. No. 4,470,874, entitled Planarization of multi-level interconnected metallization system, filed Dec. 15, 1983, incorporated herein by reference.

Although the silicon spheres are placed with random orientation, the anisotropy of mobility in Si is small, so the resulting devices that are fabricated will be much higher performance than those made using amorphous- or poly-silicon. However, if the application is less demanding and for example does not require high-speed devices, then poly-silicon or non-spherical particles can be used.

While spherical particles are preferred, powdered silicon can be used, either single- or poly-crystal, if appropriate to the performance requirements of a particular application. In addition, multiple placement cycles can be used to place particles of different sizes, or different material characteristics, such as doping or crystalline quality or atomic species, such III-V, for example GaAs, or quaternary alloys for use as optical sources, or SiGe, to realize different functionality in the final device.

Figure 5A:
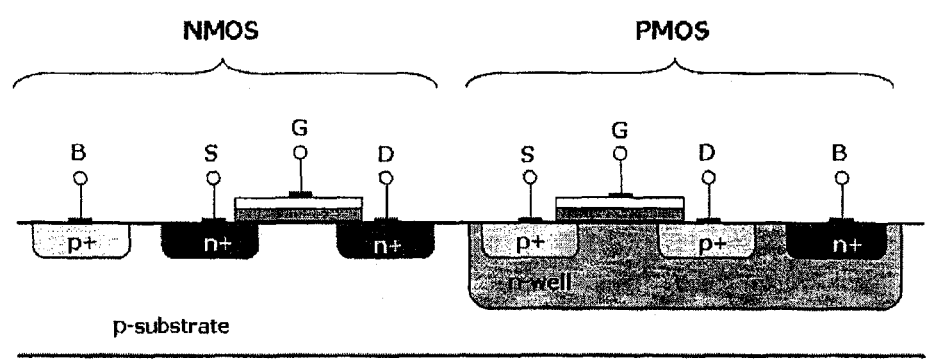
FIG. 5a is a partial cross-sectional view of complementary NMOS and PMOS circuits formed on a planarized semiconducting particle doped with a p-type material when forming the particle.

Standard photolithographic techniques are used to fabricate devices on the exposed silicon surfaces as well as fabrication of interconnects and other elements required for device functionality. The present invention allows for nearly conventional CMOS devices to be fabricated; and, it may be advantageous to utilize other processes. The present invention does not intrinsically restrict the type of process that can be used. For example, particles of n and p type silicon can be deposited in separate steps, to achieve n- and p-wells using separate silicon particles. In conventional CMOS, the n-well shown in FIG. 5a must be fabricated within the global p-type substrate. Turning now to FIG. 5b, a device similar to that of FIG. 5a is shown fabricated within a spherical particle that is doped with a p-type material for form a p-type sphere. In this figure a semi-spherical semiconductor device 50 is shown wherein a planarized sphere 56 forms a gated semiconductor transistor device having a source (S), drain (D) and Gate (G) as well a contact B which forms a substrate bias as the device is within a doped well, as shown. In this instance a single device is formed within the planarized semiconducting sphere. Each of the lines extending from the device to B, S, D, and G are electrical contacts. The number of separate devices that can be manufactured on within/upon a single crystal particle depends greatly on the size of the planarized region. For example if the device has a 1 μm gate length and 1 μm via holes, the entire device may be 5 µm×5 µm device. However, a sphere with a 20 µm diameter would have a surface area of greater than 300 µm2 which could accommodate several devices. By way of example a 2×2 pixel array or a single pixel with additional circuitry for example for lifetime-control could be inbuilt. Considerations of sphere size would be cost, reliability and yield. The device shown in FIG. 5a could be fabricated on any or all of the planar spheres shown for example in FIG. 3b.

Figure 5C:
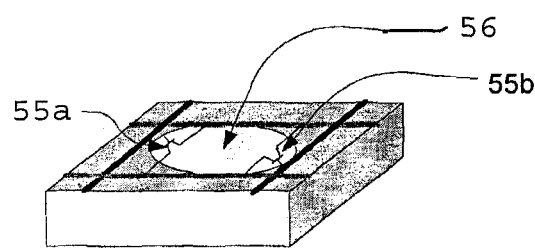
FIG. 5c is an isometric view of a circuit with symbolic representation of gated transistors shown in a planarized spherical particle. This single cell could also form a standalone circuit, be packaged and function as a standalone device, replacing a similar device fabricated on a silicon wafer.
Figure 5D:
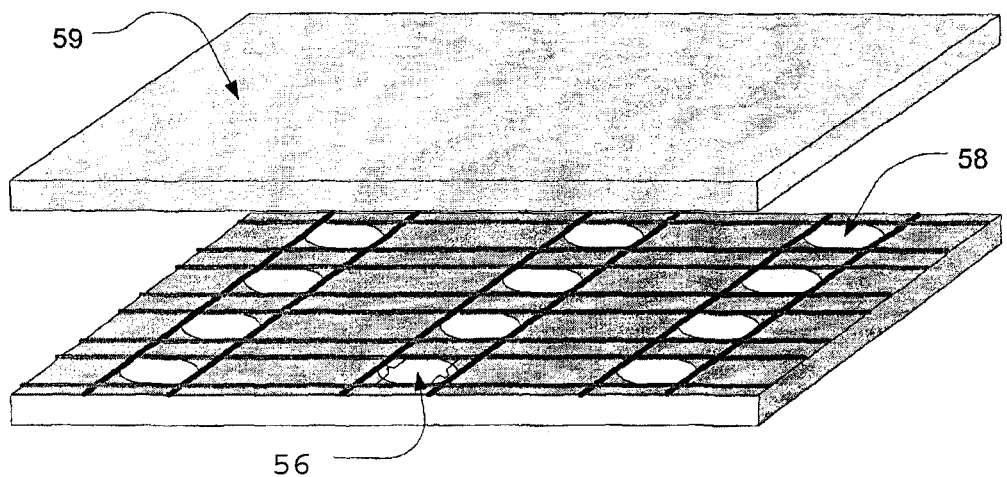
FIG. 5d shows the spherical particle of FIG. 5b illustrating that an array of such particles can be manufactured in adjacent particles not shown to have transistors therein.
Figure 6A:
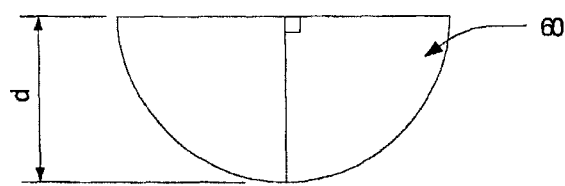
FIGS. 6a through 6d are cross-sectional views of particles wherein the maximum depth is shown normal to a planarized surface.
Figure 6B:
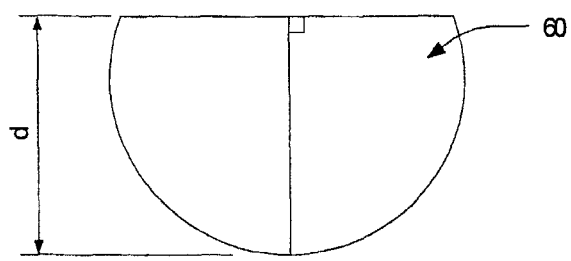
Figure 6C:
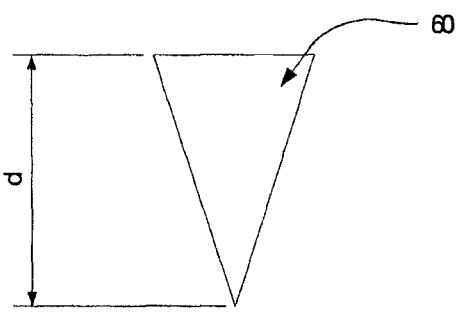
Figure 6D:
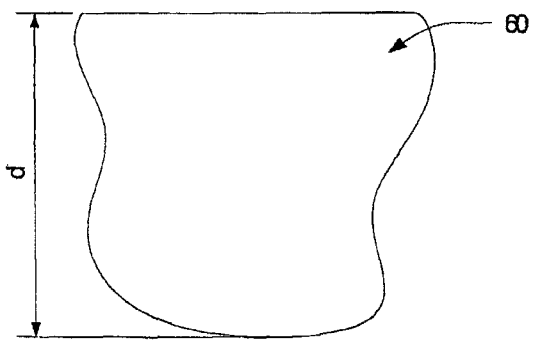

A symbolic representation of transistors 55a 55b is shown in FIGS. 5c and 5d. Further doping occurs to achieve the NMOS and PMOS devices in the same sphere. In FIG. 5c an array of controllable functional devices such as transistors can be fabricated. Although not shown in the array 58 of planarized spheres 57, an array of devices would be manufactured within the same process. That is, doping would be done to all transistors at the same time. A passivation layer 59 is applied directly over top of the planarized spheres after devices are fabricated. The layer 59 is shown before it is laid down over the active devices. Although an advantage of this invention is that an array of any size can be manufactured it may be desired to cut up the array into smaller functional units which can be placed in desired locations. Current means for cutting silicon wafers can be used in this instance.

The resulting electronic assembly can then be used as the basis for a variety of devices such as displays, or imagers.

In accordance with an aspect of this invention non-glass substrates, such as plastic, Mylar, polyimide or other application appropriate material, can also be used, allowing not only decreased cost of production, but also the realization of both flexible and moldable devices. As the dimensions of the semiconductor particle are reduced, the minimum bend radius is also reduced. For silicon particles, which are smaller than the substrate thickness, the mechanical properties will be largely dictated by the non-silicon elements of the device and so can be made either flexible or moldable or a combination thereof. Devices can also be fabricated where the mechanical properties vary throughout the device, where the mechanical stiffness is specified as a function of position within the device.

In a further variation of the present invention, large substrates can be cut to form small devices, in the same way that silicon wafers are cut into devices of a preferred size; the device is small relative to the substrate. The present techniques would applicable where the costs and performance allowed the use of non-silicon substrates. In many silicon devices for example, the area occupied by the contact pads and interconnects can be on the same order as the device area. In other applications, device performance can be enhanced by using a substrate with a large thermal conductivity. Here the spherical backside of the particle provides a larger surface through which heat can be removed.

Figure 4A:
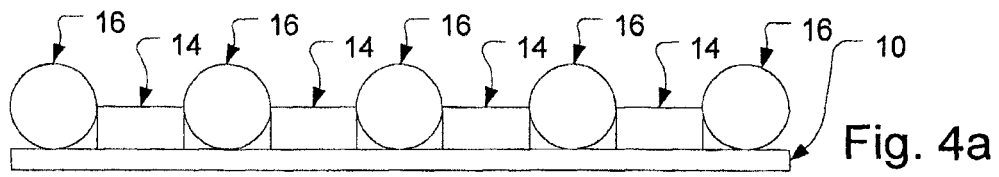
FIGS. 4a through 4f show the method of forming contacts on the planar surface and to the outside surface of a sphere for example, for providing an array of solar cells.
Figure 4B:
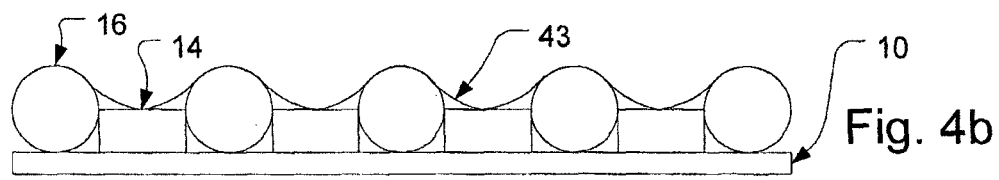
Figure 4C:
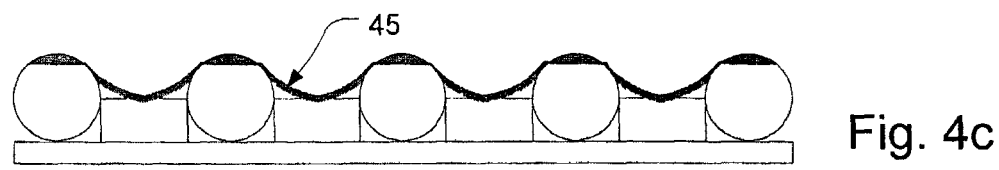
Figure 4D:
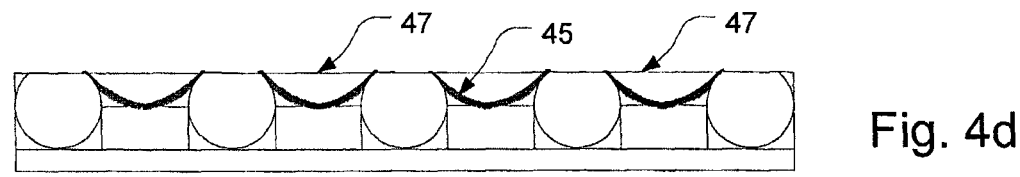
Figure 4E:
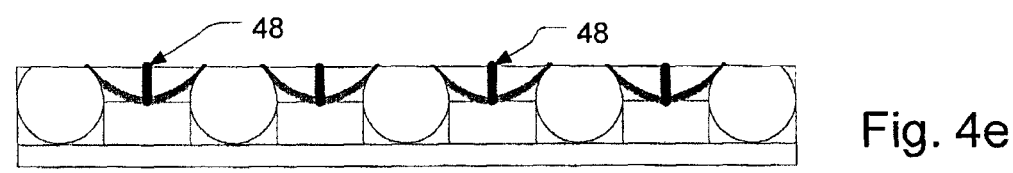
Figure 4F:
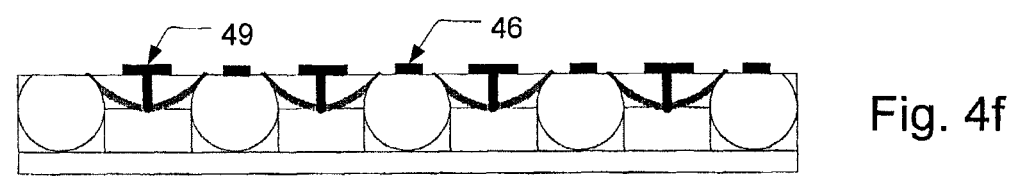

As was mentioned heretofore, this invention also allows for the manufacture of solar cells using a similar fabrication method. Turning now to FIGS. 4a through 4f a process of manufacturing solar cells is shown, wherein spheres 16 doped with p-type material shown in FIG. 4a are located in openings with a grid 14 and are fixed to the light transmissive substrate 10 they are supported by. In FIG. 4b the spheres and grid are coated in a layer 43 of SiO$_2$ and in FIG. 4c a metallization layer 45 is applied. In FIG. 4d the structure is planarized and the spheres have planar upper surfaces 47. In FIG. 4e vias and conducting plug formation 48 is provided. Also not shown in FIG. 4e, the planar region just below the planar surface is doped with n-type material and in a subsequent step in FIG. 4f interconnects 46 and 49 are formed so that all interconnects are on the planar upper surface which contact the p and n material. This upper planarized surface actually forms the backside of the solar panel.

The term planarized particle or particle having a planar surface refers to particles in a preferred embodiment that have a longest dimension across the planar surface of 15 mm and a depth (d) of at least 1 µm normal to the planar surface. Preferably these particles are spheres, spheroids or imperfect spheres or spheroids. However other particle shapes are within the scope of this invention. FIGS. 6a through 6d illustrate various particle shapes 60 and show depth (d) normal to the planar surface of the particle.

What is claimed is:

1. A semiconductor device comprising:
    a substrate;
    a semiconductor particle formed separately from the substrate and then fixed upon the substrate;
    a conformal coating covering the substrate and at least a portion of the semiconductor particle;
    the semiconductor particle planarized to remove portions of the conformal coating and the semiconductor particle and to expose at a cross-section of the semiconductor particle nor surface of less than 15 mm across its longest dimension;
        wherein at least a portion of the semiconductor particle directly below or on the planar surface is doped with a first dopant of a first type and wherein another portion of the semiconductor particle directly below or on the planar surface is doped with a second dopant of a second type;
    a first contact at or above the planar surface contacting the first dopant; and,
    a second contact at or above the planar surface contacting the second dopant;
    wherein one of the first and second dopants is n-type.

2. The semiconductor device of claim 1 configured as a gated semiconductor device at the planar surface.

3. The semiconductor device of claim 2 having a dielectric layer at the planar surface which forms a portion of a gate having a contact, electrically isolated from first and second contacts.

4. A semiconductor device array comprising a plurality of the semiconductor devices as defined in claim 1, wherein the semiconductor particles are fixed upon the substrate in random orientation and wherein the semiconductor particles have a depth normal to the planar surface in a longest dimension of at least 1 µm.

5. A semiconductor device array as defined in claim 4, wherein the semiconductor particles are truncated spherical particles.

6. A semiconductor device array as defined in claim 4 wherein the semiconductor particles are single-crystal particles.

7. A semiconductor device array as defined in claim 4 wherein the semiconductor particles are greater than 1 µm and less than 10 mm in diameter across a largest dimension of the planar surface.

8. A semiconductor device array as defined in claim 4 wherein the semiconductor particles are poly-crystalline.

9. A semiconductor device as defined in claim 1 wherein the substrate is plastic.

10. A method of forming a plurality of electronic devices on a substrate, comprising:
    providing semiconductor particles formed separately from the substrate;
    positioning the semiconductor particles at predetermined locations on the substrate;

immovably fixing the semiconductor particles in positions at the predetermined locations;

after immovably fixing the semiconductor particles, removing portions of each of the semiconductor particles so as to expose cross-sections of the semiconductor particles, wherein the cross-sections are planar surfaces less than 15 mm and greater than 1 µm across a longest dimension; and providing a controllable gated electronic component on or directly beneath each planar surface and providing at least two electrical contacts to the component supported by the planar surface.

11. A method as defined in claim 10, wherein each of the semiconductor particles has at least two differently doped regions wherein the differently doped regions are p-type and n-type.

12. A method as defined in claim 10 further comprising the step of cutting the substrate into smaller devices after controllable gated electronic components have been provided.

13. A method of forming a plurality of electronic devices on a substrate, comprising:

positioning semiconductor particles at predetermined locations on the substrate;

immovably fixing the semiconductor particles at positions at the predetermined locations;

removing portions of each of the semiconductor particles so as to expose cross-sections of the semiconductor particles, wherein the cross-sections are planar surfaces less than 15 mm and greater than 1 µm across a longest dimension; and providing a controllable gated electronic component on or directly beneath each planar surface and providing at least two electrical contacts to the component supported by the planar surface;

wherein each of the semiconductor particles has at least two differently doped regions wherein the differently doped regions are p-type and n-type; and wherein a conformal coating is applied over the semiconductor particles after immovably fixing the semiconductor particles.

14. A method as defined in claim 13 wherein the semiconductor particles are planarized spherical particles and are planarized after applying the conformal coating.

15. A method of forming a semiconductor device, comprising:

electrostatically charging a first substrate;

depositing semiconducting particles on the charged first substrate, the semiconducting particles being oppositely charged to the charged first substrate;

transferring the charged semiconducting particles to a second substrate such that the semiconducting particles are affixed to the second substrate; and planarizing the affixed semiconducting particles at a plane co-planar to a surface of the second substrate.

16. A method as defined in claim 15, wherein the first substrate comprises a drum.

17. A method as defined in claim 15, wherein the semiconducting particles are deposited on the charged first substrate according to a pattern associated with the first substrate.

18. A method as defined in claim 17, wherein the pattern is defined by at least one of: a grid affixed to the first substrate and an electrode coupled to the first substrate.

19. A method as defined in claim 15, wherein trap e n the charged semiconducting particles to the second substrate comprises:

applying adhesive to at least one of the second substrate and the semiconducting particles; and contacting the second substrate with the semiconducting particles.

\* \* \* \* \*